(12) United States Patent
Hung et al.

(10) Patent No.: US 9,780,304 B2
(45) Date of Patent: Oct. 3, 2017

(54) ARRAY SUBSTRATE, METHOD FOR INK JET PRINTING THEREON AND RELATED DEVICE

(71) Applicant: BOE TECHNOLOGY GROUP CO., LTD., Beijing (CN)

(72) Inventors: Hsiaowen Hung, Beijing (CN); Shinsuke Iguchi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/912,908

(22) PCT Filed: Aug. 10, 2015

(86) PCT No.: PCT/CN2015/086455
§ 371 (c)(1),
(2) Date: Feb. 18, 2016

(87) PCT Pub. No.: WO2016/161730
PCT Pub. Date: Oct. 13, 2016

(65) Prior Publication Data
US 2017/0047518 A1    Feb. 16, 2017

(30) Foreign Application Priority Data

Apr. 7, 2015    (CN) .......................... 2015 1 0162181

(51) Int. Cl.
*H01L 51/00* (2006.01)
*H01L 51/56* (2006.01)
(Continued)

(52) U.S. Cl.
CPC .......... *H01L 51/0004* (2013.01); *H01L 27/32* (2013.01); *H01L 27/3241* (2013.01);
(Continued)

(58) Field of Classification Search
CPC ............. H01L 51/0004; H01L 27/3246; H01L 27/3248; H01L 27/32; H01L 51/56; H01L 2227/323; H01L 51/5012
See application file for complete search history.

(56) References Cited

U.S. PATENT DOCUMENTS

2005/0093441 A1    5/2005  Uhlig et al.
2012/0040478 A1*   2/2012  Takeuchi ............ H01L 27/3246
                                                438/23
2012/0268002 A1*  10/2012  Osako ................. H01L 27/3258
                                                313/504

FOREIGN PATENT DOCUMENTS

CN    102388673 A    3/2012
CN    104795426      7/2015
(Continued)

OTHER PUBLICATIONS

International Search Report and Written Opinion with English Language Translation, dated Jan. 5, 2016, Application No. PCT/CN2015/086455.
Office Action in Chinese Application No. 201510162181.2 dated Apr. 20, 2017, with English translation.

*Primary Examiner* — Donald Raleigh
*Assistant Examiner* — Kevin Quarterman
(74) *Attorney, Agent, or Firm* — Blakely Sokoloff Taylor & Zafman LLP

(57) ABSTRACT

The present invention discloses an array substrate, a method for ink jet printing thereon, an organic electroluminescent display, and a display panel. The array substrate comprises an active region which comprises a plurality of pixel regions arranged in an array, and a contact hole region which is arranged at an outer side of the active region and comprises a plurality of contact holes. An anti-overflow region comprising at least one pixel hole is arranged between the contact hole region and the active region. By means of the pixel hole in the anti-overflow region, during ink jet printing
(Continued)

on the array substrate, the ink flowing from the active region to the contact hole region can be made to flow into the pixel hole in the anti-overflow region, thus alleviating the problem in which residual liquid in the contact holes of the contact hole region is difficult to clean up and thus leads to display defects.

15 Claims, 4 Drawing Sheets

(51) Int. Cl.
  *H01L 27/32* (2006.01)
  *H01L 51/50* (2006.01)
(52) U.S. Cl.
  CPC ...... *H01L 27/3246* (2013.01); *H01L 27/3248* (2013.01); *H01L 51/0005* (2013.01); *H01L 51/56* (2013.01); H01L 51/5012 (2013.01); H01L 2227/323 (2013.01)

(56) References Cited

FOREIGN PATENT DOCUMENTS

| JP | 2007317558 |   | 12/2007 |
|----|------------|---|---------|
| JP | 2007317558 A | * | 12/2007 |
| JP | 2014063700 |   | 4/2010  |

* cited by examiner

ARRAY SUBSTRATE, METHOD FOR INK JET PRINTING THEREON AND RELATED DEVICE

FIELD OF THE INVENTION

The present invention relates to the display technology field, and particularly to an array substrate, a method for ink jet printing thereon, an organic electroluminescent display, and a display panel.

BACKGROUND OF THE INVENTION

Films in OLED (organic electroluminescent display) are primarily formed by an evaporation process or a solution process. The evaporation process has been widely applied to small size devices, and currently has been applied in mass production. In case of being applied to large scale devices, the evaporation process suffers from great defects. For example, a light shielding plate tends to displace in the high temperature environment of the process, making it difficult to obtain a uniform rate of deposition on a base plate. The solution process primarily comprises ink jet printing, nozzle coating, spin coating, screen printing or the like. In the ink jet printing, a uniform film can be deposited by spraying liquid-state organic material, the utilization rate of material is high, and it is easy to realize large size device. Thus, the ink jet printing is considered as an important approach for mass production of a large size OLED.

However, the ink jet printing belongs to a continuous printing, and it is necessary to continuously spray liquid on the base plate. In this way, during printing as shown by a side view of an existing OLED device in FIG. 1, the liquid can be sprayed onto an excepted region apart from an active region (AA region), such as a spare region and a contact hole region. After printing, an additional process is required to clean up the liquid in the excepted region, to prevent the residual liquid from damaging the OLED device and thus leading to display defects. Currently, plasma dry etching, laser cleaning, or side-wiping is used to clean the residual liquid in the excepted region. These cleaning methods usually can not clean up a region with micro-patterns in the excepted region. For example, if there is residual liquid in a through hole in the contact hole region, it is difficult to clean up the residual liquid. However, the residual liquid in the through hole tends to lead to display defects.

Therefore, it is urgent for a skilled in the art to effectively prevent liquid from being residual in a region with micro-pattern in the excepted region.

SUMMARY OF THE INVENTION

In view of this, embodiments of the present invention provide an array substrate, a method for ink jet printing thereon, an organic electroluminescent display, and a display panel, which can effectively prevent liquid from being residual in a region with micro-patterns in the excepted region.

Therefore, an embodiment of the present invention provides an array substrate, comprising an active region which comprises a plurality of pixel regions arranged in an array, and a contact hole region which is arranged at an outer side of the active region and comprises a plurality of contact holes; further comprising:

an anti-overflow region which is arranged between the contact hole region and the active region and comprises at least one pixel hole.

In a possible implementation, the array substrate further comprises a spare region between the outer side of the active region and the anti-overflow region, the spare region comprises at least a column of spare pixel regions, and the spare pixel regions have a same shape and size as the pixel regions.

In a possible implementation, the anti-overflow region comprises one pixel hole, and a length of the pixel hole in a column direction of the pixel regions is not smaller than an overall length of the pixel regions in the column direction.

In a possible implementation, the pixel regions and the pixel hole satisfy the following formula:

$$L/P \times S \leq S'$$

wherein P indicates a length of one of the pixel regions in a row direction, L indicates a length of the pixel hole in the row direction of the pixel regions, S indicates a sum of areas of the pixel regions in a column, and S' indicates an area of the pixel hole.

In a possible implementation, the anti-overflow region comprises at least a column of pixel holes, and an overall length of the pixel holes in a column direction is not smaller than an overall length of the pixel regions in the column direction.

In a possible implementation, the pixel regions and the pixel holes satisfy the following formula:

$$L/P \times S \leq S'$$

wherein P indicates a length of one of the pixel regions in a row direction, L indicates a length of one of the pixel holes in the row direction of the pixel regions, S indicates an area of one of the pixel regions, and S' indicates an area of one of the pixel holes.

In a possible implementation, the pixel holes have a depth larger than that of the contact holes.

In a possible implementation, the respective pixel hole in the anti-overflow region is a groove formed by etching a base plate of the array substrate with photolithography process.

An embodiment of the present invention provides an organic electroluminescent display, comprising the above-described array substrate.

An embodiment of the present invention further provides a display panel, comprising the above-described organic electroluminescent display.

An embodiment of the present invention further provides a method for ink jet printing on the above-described array substrate, comprising:

spraying the required ink on the array substrate, in a manner that the array substrate travels in a direction perpendicular to that of a spray head.

In a possible implementation, the method further comprises:

prior to spraying the required ink, shielding the contact hole region on the array substrate with a mask.

Embodiments of the present invention have the following beneficial effects.

Embodiments of the present invention provide an array substrate, a method for ink jet printing thereon, an organic electroluminescent display, and a display panel. The array substrate comprises an active region which comprises a plurality of pixel regions arranged in an array, and a contact hole region which is arranged at an outer side of the active region and comprises a plurality of contact holes. An anti-overflow region comprising at least one pixel hole is arranged between the contact hole region and the active region. By means of the pixel hole in the anti-overflow region, during ink jet printing on the array substrate, the ink flowing from the active region to the contact hole region can be made to flow into the pixel hole in the anti-overflow region, thus alleviating the problem in which residual liquid in the contact holes of the contact hole region is difficult to clean up and thus leads to display defects.

DETAILED DESCRIPTION OF THE INVENTION

Figure 1:
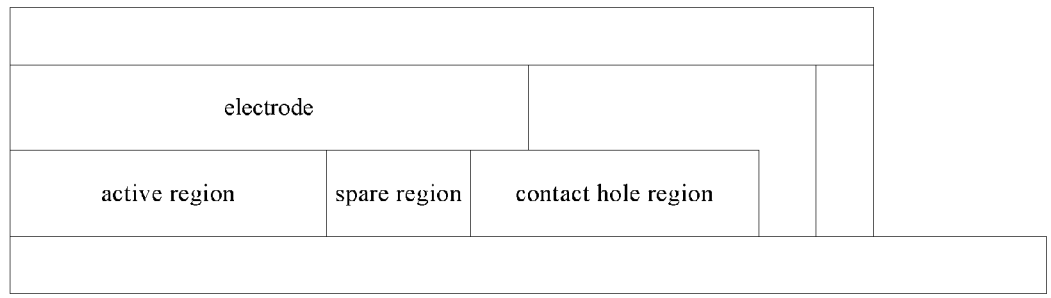
FIG. 1 is a schematic structural view for illustrating an OLED in the prior art.

The array substrate, the method for ink jet printing thereon, the organic electroluminescent display, and the display panel in embodiments of the present invention will be described hereinafter in detail with reference to the accompanying drawings.

The thickness and shape for each film in the drawings does not reflect the actual proportion of the array substrate, and only intends to schematically illustrate the present invention.

Figure 2:
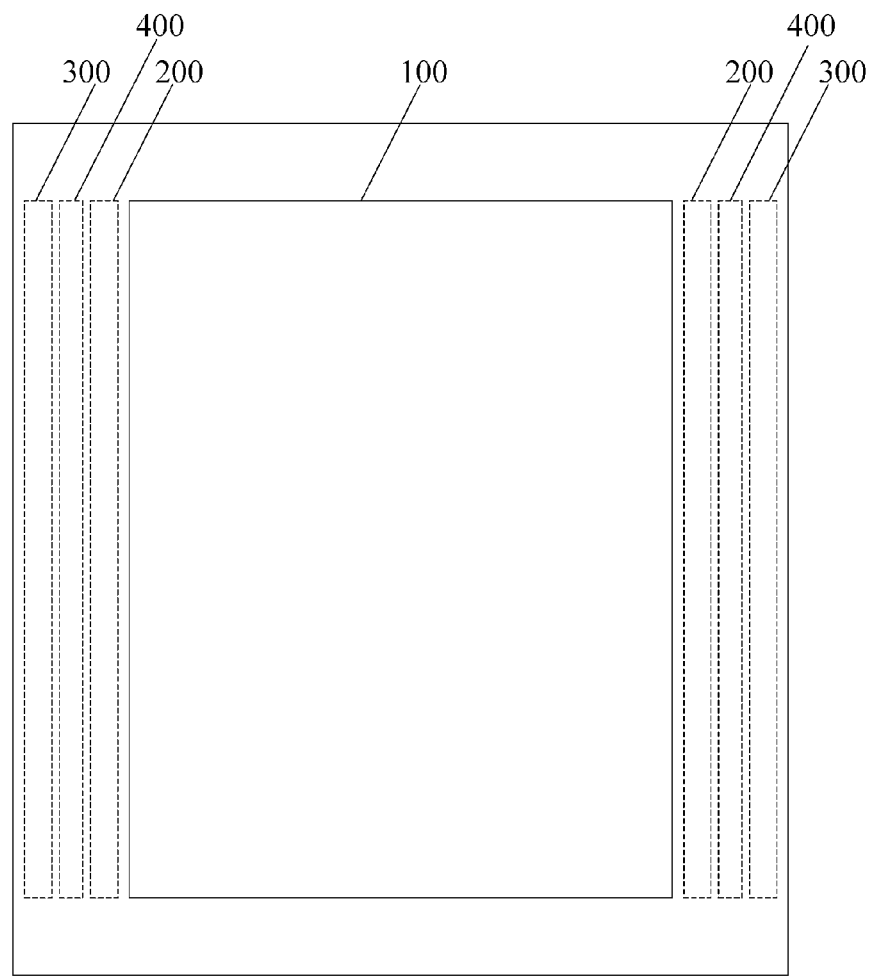
FIG. 2 is a schematic structural view for illustrating an array substrate in an embodiment of the present invention.

An embodiment of the present invention provides an array substrate, as shown in FIG. 2, comprising an active region 100 which comprises a plurality of pixel regions arranged in an array, and a contact hole region 300 which is arranged at an outer side of the active region 100 and comprises a plurality of contact holes. The array substrate further comprises an anti-overflow region 400 which is arranged between the contact hole region 300 and the active region 100 and comprises at least one pixel hole.

Figure 3A:
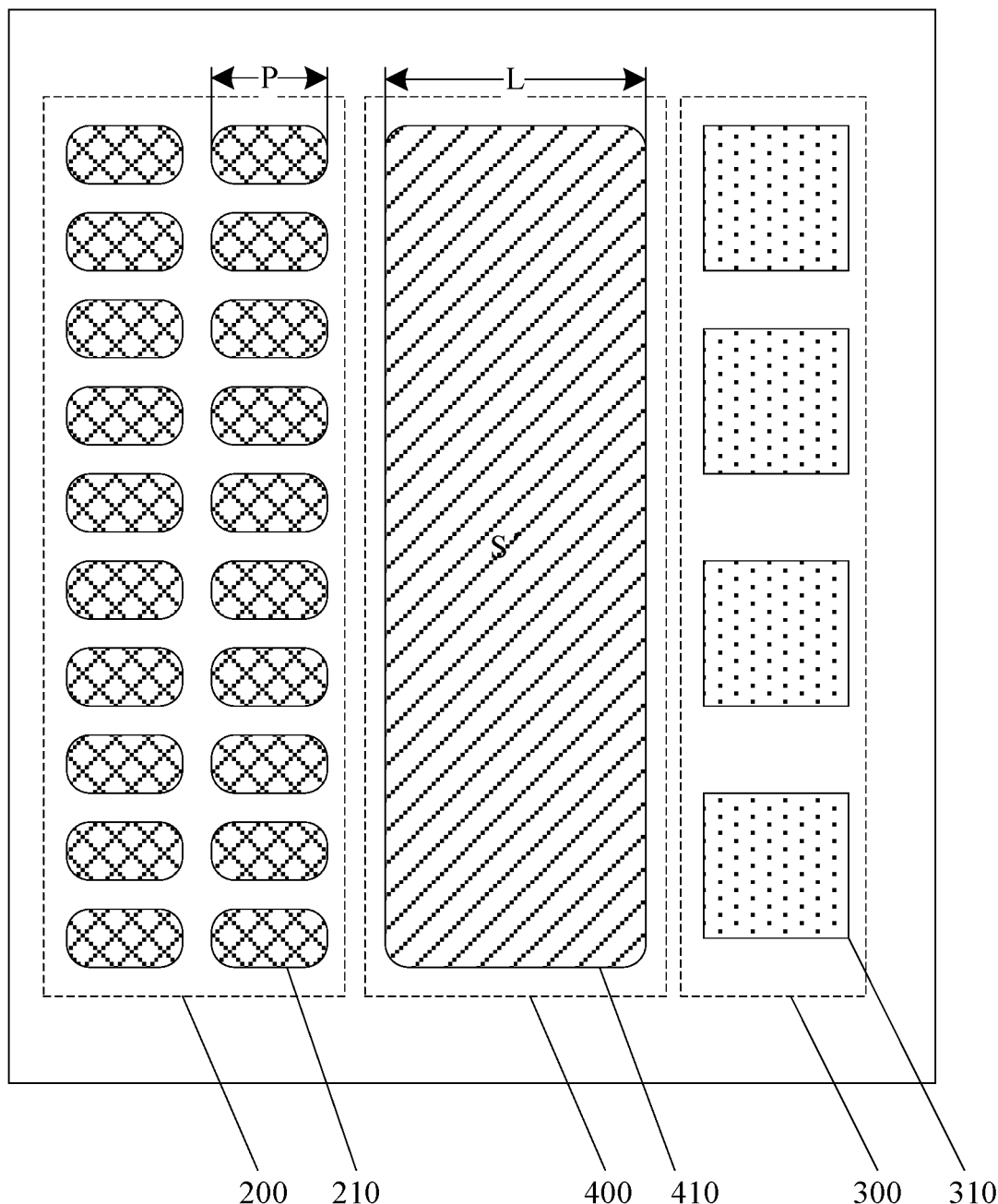
FIG. 3a and FIG. 3b are local views for illustrating an array substrate in an embodiment of the present invention.
Figure 3B:
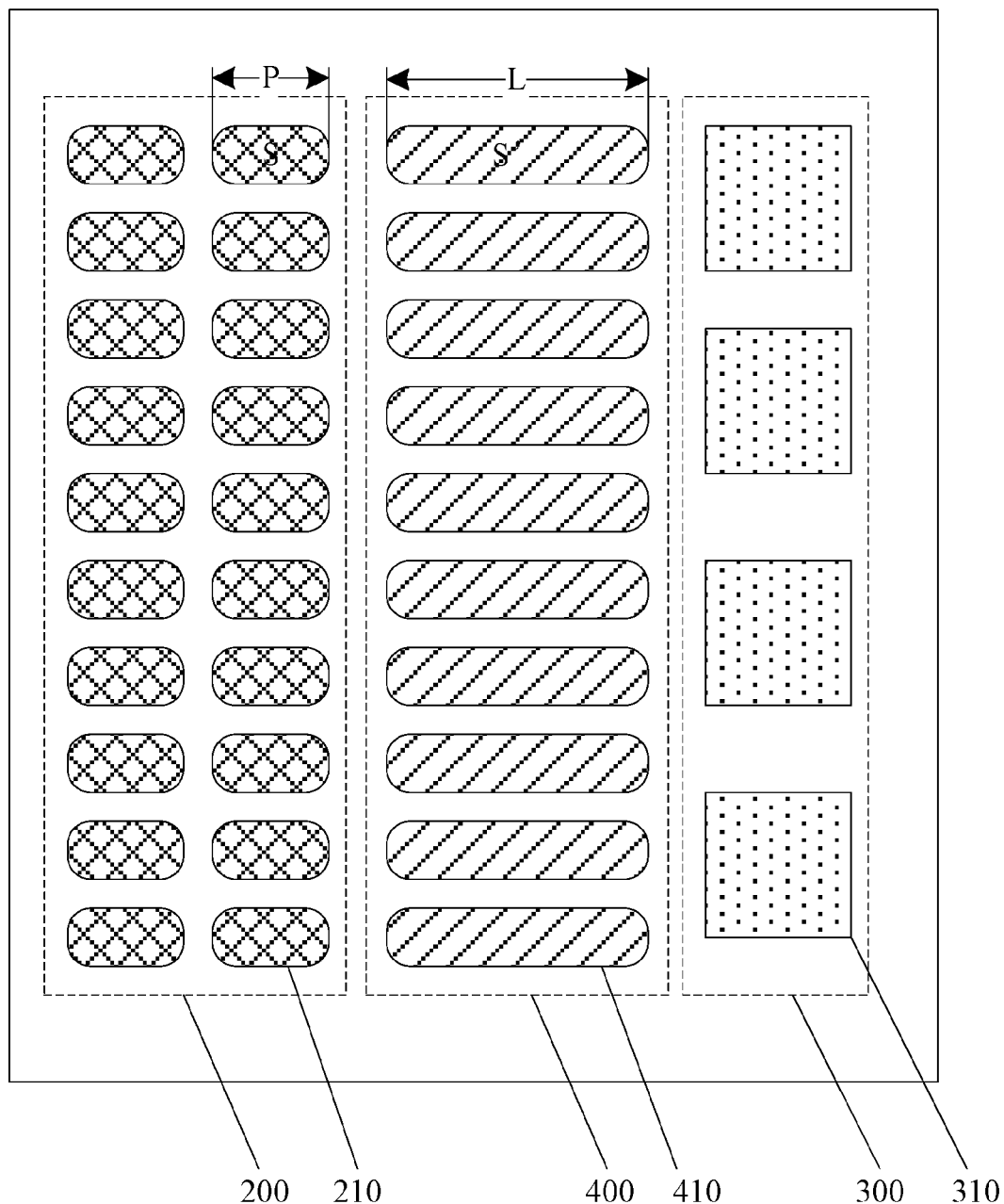

Generally, as shown in FIG. 2, the array substrate further comprises a spare region 200 which is arranged between the outer side of the active region 100 and the anti-overflow region 400 and comprises at least a column of spare pixel regions. The spare pixel regions and the pixel regions have a same shape and size. FIG. 3a and FIG. 3b show a case in which two columns of spare pixel regions 210 are arranged in the spare region 200. The spare pixel regions 210 in the spare region 200 can function to repair or compensate for the pixel regions in the active region 100. Therefore, the spare pixel regions 210 in the spare region 200 should be identical to the pixel regions in the active region 100. Namely, during ink jet printing on the array substrate, the ink should also be filled into the spare pixel regions 210 in the spare region 200. However, the contact holes 310 in the contact hole region 300 which is arranged at the outer side of the spare region 200 function to connect the pixel regions in the active region 100 with an external circuit. Residual ink in the contact holes 310 would have adverse effect on the connecting function of contact holes at a subsequent stage. Therefore, it is necessary to clean up the residual ink in the contact holes 310.

In an embodiment of the above array substrate, the anti-overflow region 400 with at least one pixel hole 410 is arranged in a space between the active region 100 and the contact hole region 300. By means of the pixel hole 410 in the anti-overflow region 400, during ink jet printing on the array substrate, the ink flowing from the active region 100 to the contact hole region 300 can be made to flow into the pixel hole 410 in the anti-overflow region 400, thus alleviating the problem in which residual liquid in the contact holes 210 of the contact hole region 300 is difficult to clean up and thus leads to display defects.

Figure 4:
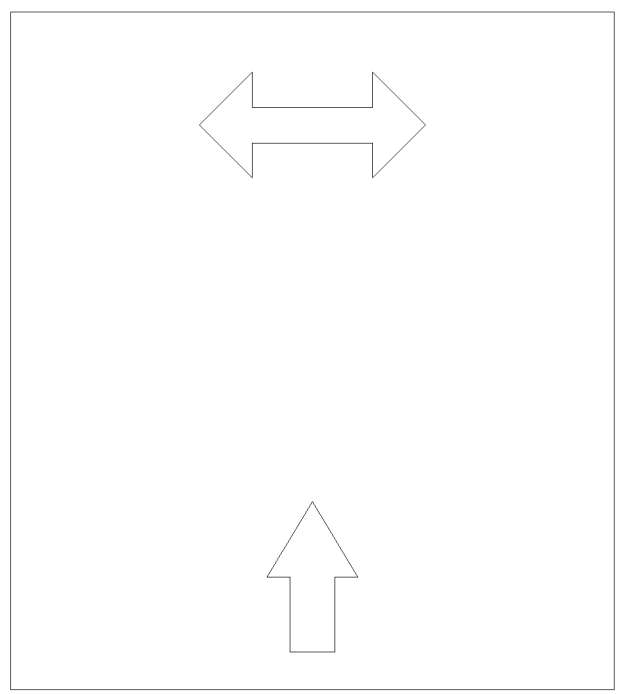
FIG. 4 is a schematic view for illustrating travelling directions during ink jet printing on an array substrate in an embodiment of the present invention.

In implementations of the above array substrate, the pixel hole 410 can be arranged in the anti-overflow region 400 in various manners. For example, as shown in FIG. 3a, only one pixel hole 410 can be arranged in the anti-overflow region 400, and a length of the pixel hole 410 in a column direction of the pixel regions (i.e., equivalent to the spare pixel regions 210) should not be smaller than an overall length of the pixel regions (i.e., equivalent to the spare pixel regions 210) in a column direction. In this way, during ink jet printing on the array substrate, as shown in FIG. 4, the array substrate travels in a direction perpendicular to that of a spray head, i.e., a travelling direction of the array substrate is identical to the column direction of the spare pixel regions in the spare region, and a travelling direction of the spray head is directed from the spare region to the contact hole region. As a result, since the length of the pixel hole 410 in the column direction of the pixel regions (i.e., equivalent to the spare pixel regions 210) is set to be not smaller than the overall length of the pixel regions (i.e., equivalent to the spare pixel regions 210) in the column direction, it is ensured as much as possible that the ink from the active region 100 to the contact hole region 300 flows into the anti-overflow region 400.

Furthermore, to ensure that the ink flowing from the active region 100 to the contact hole region 300 flows into the anti-overflow region 400, in implementations, as shown in FIG. 3a, the pixel regions (i.e., equivalent to the spare pixel regions 210) and the pixel hole 410 can be set to satisfy the following formula:

$$L/P \times S \leq S'$$

wherein P indicates a length of one of the pixel regions (i.e., equivalent to the spare pixel regions 210) in a row direction, L indicates a length of the pixel hole 410 in a row direction of the pixel region (i.e., equivalent to the spare pixel regions 210), S indicates a sum of areas of the pixel regions in a column, and S' indicates an area of the pixel hole 410.

In implementations of the above array substrate, the pixel hole 410 can be arranged in the anti-overflow region 400 in a manner other than the manner shown in FIG. 3a, in which only one pixel hole 410 is arranged in the anti-overflow region 400. As shown in FIG. 3b, at least a column of pixel holes 410 can be arranged in the anti-overflow region 400. An overall length of the pixel hole 410 in the column direction is not smaller than an overall length of the pixel regions (i.e., equivalent to the spare pixel regions 210) in the column direction. In addition, as shown in FIG. 3b, each column of pixel holes 410 can be arranged in one-to-one correspondence to each column of pixel regions (i.e., equivalent to the spare pixel regions 210). In this way, during ink jet printing on the array substrate, as shown in FIG. 4, the array substrate travels in a direction perpendicular to that of a spray head, i.e., a travelling direction of the array substrate is identical to the column direction of the spare pixel regions in the spare region, and a travelling direction of the spray head is directed from the spare region to the contact hole region. As a result, since the overall length of the pixel hole 410 in the column direction is set to be not smaller than the overall length of the pixel regions (i.e., equivalent to the spare pixel regions 210) in the column direction, it is ensured as much as possible that the ink from the active region 100 to the contact hole region 300 flows into the anti-overflow region 400.

Furthermore, to ensure that the ink flowing from the active region 100 to the contact hole region 300 flows into the anti-overflow region 400, in implementations, as shown in FIG. 3b, the pixel regions (i.e., equivalent to the spare pixel regions 210) and the pixel hole 410 can be set to satisfy the following formula:

$$L/P \times S \leq S'$$

wherein P indicates a length of one of the pixel regions (i.e., equivalent to the spare pixel regions 210) in the row direction, L indicates a length of one of the pixel holes 410 in the row direction of the pixel regions (i.e., equivalent to the spare pixel regions 210), S indicates an area of one of the pixel regions (i.e., equivalent to the spare pixel regions 210), and S' indicates an area of one of the pixel hole 410.

In implementations of the above array substrate, to prevent the ink flowing into the contact hole region 300, the pixel hole 410 can have a depth larger than that of the contact holes 310. In this way, even in case that the ink flows into the contact hole region 300, the ink will firstly flow into the pixel hole 410 with a larger depth due to gravity, and will not flow into the contact holes 310.

Furthermore, in above the array substrate, each pixel hole 410 in the anti-overflow region 400 can be a groove formed by etching a base plate of the array substrate with photolithography process.

Base on a same inventive concept, an embodiment of the present invention further provides a method for ink jet printing on the above array substrate, comprising the following steps: spraying the required ink on the array substrate, in a manner that the array substrate travels in a direction perpendicular to that of a the spray head. As shown in FIG. 4, generally the array substrate has a travelling direction identical to the column direction of the spare pixel regions of the spare region, i.e., in a vertical direction. The spray head has a travelling direction which is directed from the spare region to the contact hole region, i.e., in a horizontal direction.

By means of the pixel hole in the anti-overflow region between the contact hole region and the spare region, during ink jet printing on the array substrate, the ink flowing from the active region to the contact hole region can be made to flow into the pixel hole in the anti-overflow region, thus alleviating the problem in which residual liquid in the contact holes of the contact hole region is difficult to clean up and thus leads to display defects.

Furthermore, in implementations of the above method, the method can further comprises the following step: prior to spraying the required ink, shielding the contact hole region on the array substrate with a mask. In this way, it is possible to further prevent the ink from flowing into the contact hole region.

Based on a same inventive concept, an embodiment of the present invention further provides an organic electroluminescent display comprising the above array substrate. Since the organic electroluminescent display intends to solve a same problem as the above array substrate, reference can be made to the above array substrate for implementations of the organic electroluminescent display, which are not repeated here for simplicity.

Based on a same inventive concept, an embodiment of the present invention further provides a display device, comprising the above organic electroluminescent display. The display device can any product or component with a display function like a mobile phone, tablet computer, TV, monitor, notebook computer, digital photo frame, and navigator. Reference can be made to the above array substrate for implementations of the display device, which are not repeated here for simplicity.

Embodiments of the present invention provide an array substrate, a method for ink jet printing thereon, an organic electroluminescent display, and a display panel. The array substrate comprises an active region which comprises a plurality of pixel regions arranged in an array, and a contact hole region which is arranged at an outer side of the active region and comprises a plurality of contact holes. An anti-overflow region comprising at least one pixel hole is arranged between the contact hole region and the active region. By means of the pixel hole in the anti-overflow region, during ink jet printing on the array substrate, the ink flowing from the active region to the contact hole region can be made to flow into the pixel hole in the anti-overflow region, thus alleviating the problem in which residual liquid in the contact holes of the contact hole region is difficult to clean up and thus leads to display defects.

Although the present invention has been described above with reference to specific embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:

1. An array substrate, comprising an active region which comprises a plurality of pixel regions arranged in an array, and a contact hole region which is arranged at an outer side of the active region and comprises a plurality of contact holes; further comprising:
   an anti-overflow region which is arranged between the contact hole region and the active region and comprises at least one pixel hole,
   wherein the anti-overflow region comprises one pixel hole, and a length of the pixel hole in a column direction of the pixel regions is not smaller than an overall length of the pixel regions in the column direction.

2. The array substrate of claim 1, wherein further comprising a spare region between the outer side of the active region and the anti-overflow region, the spare region comprises at least a column of spare pixel regions, and the spare pixel regions have a same shape and size as the pixel regions.

3. The array substrate of claim 1, wherein the pixel regions and the pixel hole satisfy the following formula:

$$L/P \times S \leq S'$$

wherein P indicates a length of one of the pixel regions in a row direction, L indicates a length of the pixel hole in the row direction of the pixel regions, S indicates a sum of areas of the pixel regions in a column, and S' indicates an area of the pixel hole.

4. The array substrate of claim 1, wherein
   the anti-overflow region comprises at least a column of pixel holes, and an overall length of the pixel holes in a column direction is not smaller than an overall length of the pixel regions in the column direction.

5. The array substrate of claim 4, wherein the pixel regions and the pixel holes satisfy the following formula:

$$L/P \times S \leq S'$$

wherein P indicates a length of one of the pixel regions in a row direction, L indicates a length of one of the pixel holes in the row direction of the pixel regions, S indicates an area of one of the pixel regions, and S' indicates an area of one of the pixel holes.

6. The array substrate of claim 1, wherein the pixel holes have a depth larger than that of the contact holes.

7. The array substrate of claim 1, wherein the respective pixel hole in the anti-overflow region is a groove formed by etching a base plate of the array substrate with photolithography process.

8. An organic electroluminescent display, comprising the array substrate of claim 1.

9. A display panel, comprising the organic electroluminescent display of claim 8.

10. A method for ink jet printing on the array substrate of claim 1, comprising:
spraying the required ink on the array substrate, in a manner that the array substrate travels in a direction perpendicular to that of a spray head.

11. The method of claim 10, further comprising:
prior to spraying the required ink, shielding the contact hole region on the array substrate with a mask.

12. The array substrate of claim 2, wherein
the anti-overflow region comprises at least a column of pixel holes, and an overall length of the pixel holes in a column direction is not smaller than an overall length of the pixel regions in the column direction.

13. The array substrate of claim 12, wherein the pixel regions and the pixel holes satisfy the following formula:

$$L/P \times S \leq S'$$

wherein P indicates a length of one of the pixel regions in a row direction, L indicates a length of one of the pixel holes in the row direction of the pixel regions, S indicates an area of one of the pixel regions, and S' indicates an area of one of the pixel holes.

14. The array substrate of claim 2, wherein the pixel holes have a depth larger than that of the contact holes.

15. The array substrate of claim 2, wherein the respective pixel hole in the anti-overflow region is a groove formed by etching a base plate of the array substrate with photolithography process.

* * * * *